US005543708A

United States Patent [19]

Stauber

[11] Patent Number: 5,543,708

[45] Date of Patent: Aug. 6, 1996

[54] METHOD AND APPARATUS FOR CONTROLLING CONTINUOUSLY CONVEYED PRINTED PRODUCTS

[75] Inventor: Hans-Ulrich Stauber, Grüt, Switzerland

[73] Assignee: Ferag AG, Hinwil, Switzerland

[21] Appl. No.: 360,046

[22] Filed: Dec. 20, 1994

[30] Foreign Application Priority Data

Feb. 9, 1994 [CH] Switzerland .......................... 00375/94

[51] Int. Cl.$^6$ ............................ G01R 19/00; B65H 7/06

[52] U.S. Cl. .......................... 324/133; 324/500; 340/674; 340/676; 227/6; 227/7; 271/258.01; 271/258.04

[58] Field of Search .................................... 324/500, 555, 324/556; 340/673, 674, 675, 676, 677; 271/258.01, 258.04; 227/1, 2, 5, 6, 7

[56] References Cited

U.S. PATENT DOCUMENTS

| | | | |
|---|---|---|---|
| T958,003 | 5/1977 | Russel et al. . | |
| 3,967,770 | 7/1976 | Davis | 227/2 |
| 4,437,600 | 3/1984 | Störr . | |
| 4,750,661 | 6/1988 | Pane . | |
| 4,883,264 | 11/1989 | Yoshikawa et al. | 271/258.01 |
| 5,087,027 | 2/1992 | Acquaviva | 340/675 X |
| 5,446,670 | 8/1995 | Hunziker | 271/258.04 |

*Primary Examiner*—Kenneth A. Wieder
*Assistant Examiner*—Glenn W. Brown
*Attorney, Agent, or Firm*—Spencer & Frank

[57] ABSTRACT

A method and apparatus for controlling a conveyance of printed products are provided according to which the printed products are conveyed continuously and in successive manner in a conveying direction into a region adjacent a circuit when the circuit is open. The circuit includes at least two conductor parts and a voltage source. The printed products are scanned by simultaneously bringing the two conductor parts into scanning contact with a metallic contact portion of either a printed product or of a support therefore where such support is provided. The circuit is thus closed for allowing electric current to flow in the circuit. An actual time behavior of the electric current flowing in the circuit is monitored and a control signal in response to a divergence of the actual time behavior of the electric current from a desired time behavior of the electric current is generated.

24 Claims, 4 Drawing Sheets

FIG. 1b
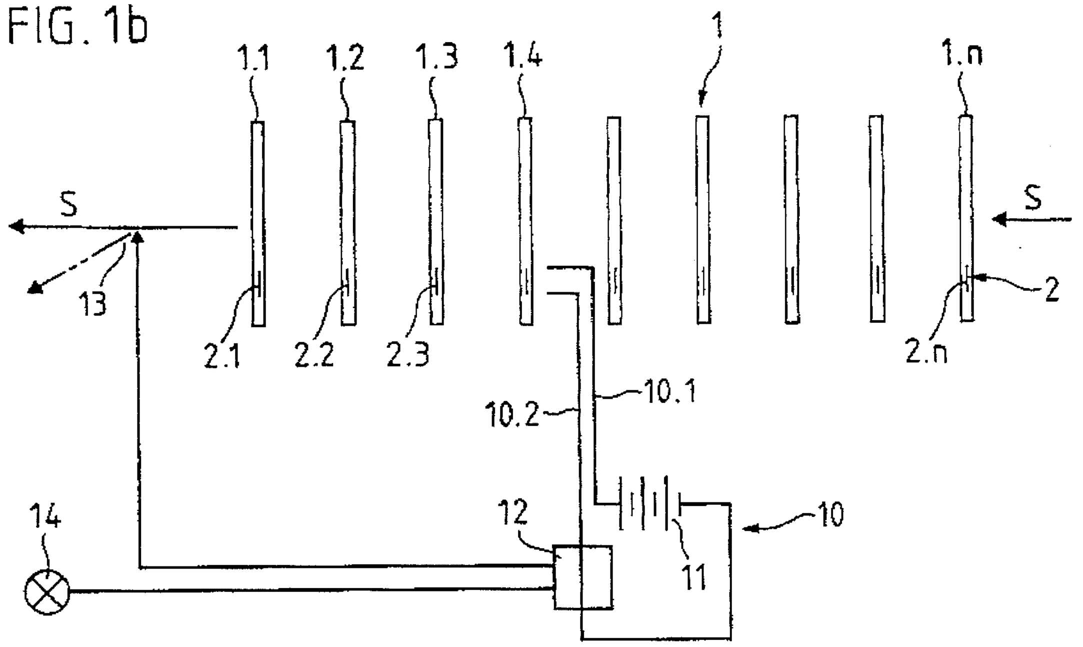
FIG. 1a
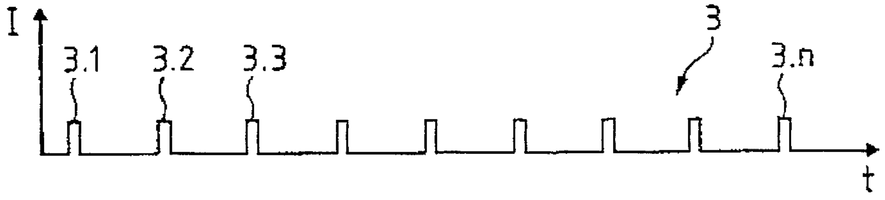
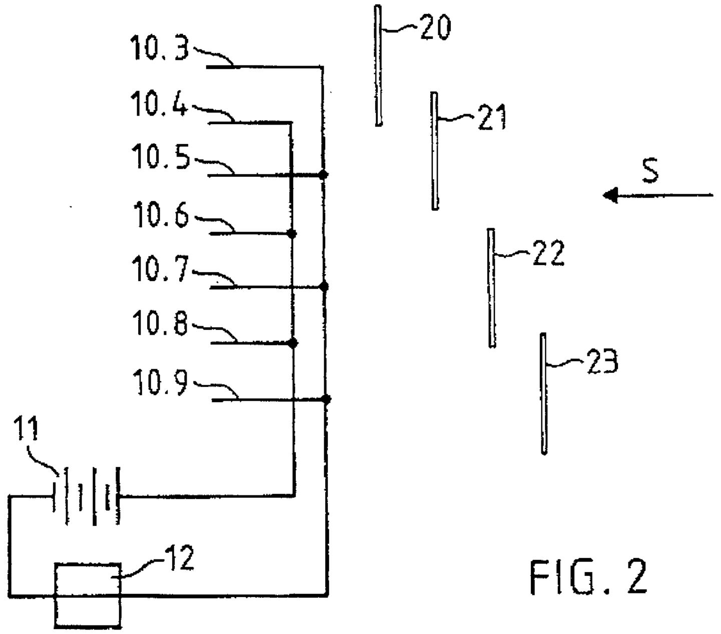
FIG. 2

METHOD AND APPARATUS FOR CONTROLLING CONTINUOUSLY CONVEYED PRINTED PRODUCTS

FIELD OF THE INVENTION

The invention is in the field of the processing of printed products and relates to a method and an apparatus for the control, checking or inspection of continuously conveyed printed products.

BACKGROUND OF THE INVENTION

In order to avoid faulty products or in order to remove the latter as rapidly as possible after its detection, printed products are controlled in various ways during their further processing, which for example can involve the stages of folding, cutting, collecting, binding and/or stitching or stapling, where the printed products are advantageously monitored without their continuous conveying effected by a random sensor arrangement being impaired. There are sensor arrangements operating in a contactless manner (light barriers, image recording and processing methods, induction measurements, etc.) and sensor arrangements enabling the printed product to be scanned (mechanical probes, thickness measurements, etc.).

In many cases, where both control methods with contactless sensor arrangements and control methods in volume contact can be implemented, preference is given to the contactless method, although in many cases it is more complicated. This more particularly applies in the case of controls of sensitive products conveyed at high speeds, because as a result of the contactless control it is possible to exclude any marking on or risk of damage to the sensitive products being conveyed.

An example of such a contactless control of continuously conveyed printed products is the control of stapling by a contactless induction measurement of the stapling point, which in the presence of a metal staple fitted at the intended stapling point in the intended manner supplies a different measurement result as compared with when the staple is omitted. This stapling control is contactless and there is no risk that the printed products, even if very rapidly conveyed, could in any way be undesirably marked or damaged. However, this contactless control is not only complicated, but also in many cases unreliable, as will be shown hereinafter.

Folded sheets are for example collected on a continuously moving, saddle-shaped support, in such a way that the folded edges of the collected or collated sheets are superimposed over the saddle line (or over a narrow saddle face) of the support and the two folded parts are located on both sides of the saddle line. The finished, brochure-like group of folded sheets is then guided with the support through at least one stitching or stapling station, where the folded sheets are stapled together by means of at least one wire staple. Conventionally, the staples (a piece of wire bent at both sides) is driven from the outside of the folded edge through the group of sheets and closed on the inside of the folded edge, in that the bent wire ends are bent against one another against the saddle face of the support or by correspondingly inserted bending tools. As a result of the stapling process, a stapled printed product is obtained from a plurality of brochure-like, folded sheets arranged on the support and the staple or staples are positioned over the support saddle line. For checking the stapling of the folded sheets the support with the stapled printed product is guided into the vicinity of a sensor, which scans in contactless manner by an induction measurement, the staple part located on the outside of the folded edge.

As stated hereinbefore, the control of the stapling by an induction measurement in the vicinity of the stapling point following the stapling process is complicated and leads to very varied difficulties. On the one hand the measurement result is sensitive as a function of the precise distance between the staple and the measuring head, this distance not only being dependent on the thickness (number and thickness of the collated sheets) of the group of sheets to be stapled together, but in particular on the precise shape of the staple in the stapled product. The distance between the measuring head and the staple part to be detected is admittedly adjusted for particular products to be stapled, but not for a specific staple shape, because the shape of a staple can vary as a function of variations in the bending process for the staples between individual products even in the case where the products being stapled have the same thickness. On the other hand the inductive measurement can be very easily disturbed by other, metallic parts present in the overall arrangement (e.g. the support or parts thereof) and in particular by other staples which are not to be controlled and with which for example subgroups of collected sheets have been stapled together beforehand and where the position of those staples on the length of the folded edge is not in certain circumstances accurately defined.

Other examples of the disadvantages of using contactless control methods, particularly with inductive measuring methods, also exist in other printed product processing fields.

SUMMARY OF THE INVENTION

The problem of the invention is to provide a method for controlling, checking or inspecting continuously conveyed printed products and an apparatus for performing the method. The method and apparatus are intended to combine the advantages of a contactless control which include an elimination of markings on and a risk of damage to the printed products with those of a control involving contact which include simplicity, and a reduced susceptibility to fault.

This problem is solved by the method and apparatus, of the present invention as will be described below.

The fundamental idea of the method according to the invention is to bring about a simultaneous contact between a continuously conveyed contact object (printed product or support) and two quasi-stationary conductor parts of an open circuit with a voltage source (a.c. or d.c. voltage), a current being produced in the circuit if the contact object (or at least the surface thereof participating in the contact) is electrically conductive. The circuit is monitored according to per se known electrical and electronic methods, and, in the case of a fault-caused divergence of the time behaviour of the current flowing in the circuit with respect to a desired behaviour, in known manner, alarm and/or control signals are generated with which attention can be drawn to the fault or faulty products can be discharged.

As will be described in detail hereinafter, the contact object can for example be the stapling point on the folded edge of a printed product (in the fault-free case: a metal staple), or a part of a metal support exposed through a gap in the printed product, or a corresponding positioning of the printed product in the fault-free case. In the first two cases it is not the printed product per se which is scanned, (hence an elimination of markings or a risk of damage) but rather the staple, which is a less sensitive component or the support. The printed product is only scanned in the case of a fault (i.e. where no staples or gaps are present, or where the printed products are incorrectly positioned). Thus, the printed product is scanned as an exception, the contacted, faulty product optionally being discharged from the further processing arrangement, so that damage or marking by the contact is not relevant. For less sensitive printed products the method according to the invention can obviously also be extended to cases where the actual printed product is scanned, i.e. for example to check the presence of a product on a metal support or the like.

BRIEF DESCRIPTION OF THE DRAWINGS

The fundamental idea of the method according to the invention and applications thereof and exemplified embodiments of the apparatus according to the invention are described in greater detail with respect to the drawings where:

FIG. 1*a* shows a diagram of the time behavior graph of the printed products scanned according to the control method of the invention;

FIG 1*b* shows an embodiment of the apparatus according to the invention in plan view.

FIG. 2 shows a diagram of another embodiment of the apparatus according to the invention.

DESCRIPTION OF THE PREFERRED EMBODIMENTS

Figure 3:
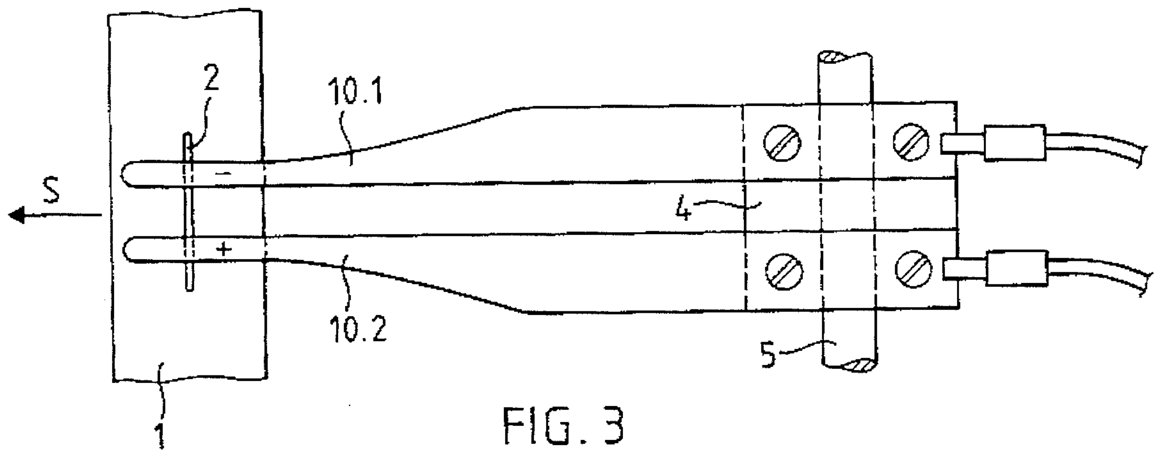
FIG. 3 shows a top plan view of a detail of an exemplified embodiment of the apparatus according to the invention for checking the stapling of continuously conveyed printed products in a plane perpendicular to the conveying direction of the continuously conveyed printed products.

FIG. 1*a* diagrammatically shows the time behavior, or the current intensity versus time graph of the printed products scanned according to the method of the invention, and FIG. 1*b* shows an exemplified embodiment of the apparatus according to the invention. These issues provide an example of an arrangement for controlling, checking or inspecting the stapling or stitching of printed products continuously conveyed on saddle-shaped supports. The supports on the one hand serve as a conveying means and on the other as abutments for the scanning operation. In FIG. 1*b*, it is possible to see the stream of printed products 1 (1.1 to 1.n) conveyed in the direction S, the products being shown in top plan view against the saddle line or face of the supports (not shown). Each product has in each case one staple 2 (2.1 to 2.n). In the vicinity of the product flow is provided an open circuit 10 with two conductor parts 10.1 and 10.2, a voltage source 11 and a measuring and processing unit 12 connected into the circuit. The two conductor parts form a measuring gap, the printed products being conveyed past the measuring gap in such a way that each correctly applied staple 2 (2.1 to 2.n) is simultaneously contacted by both conductor parts and consequently the circuit is closed over the measuring gap, so that a current flows therein.

The time path or behaviour 3 to be expected of the current intensity in the circuit 10 is shown below the control arrangement in FIG. 1*a* as a representation of the current intensity I against the time t. For each product this behaviour reveals a deflection (3.1 to 3.n) of the current intensity. If this deflection is omitted for a product, it means that the staple is missing thereon. An omitted deflection can also mean the lack of a product in the case of a non-conducting support. The measuring and processing unit 12 measures the time behaviour of the current flowing in the circuit, compares the measurement with a desired or nominal behaviour and, in the case of divergences, generates control signals, with which, for example a switch point 13 for the discharge of faulty products is set, or a staple with a faulty product is opened, or alarm signals such as an alarm light 14, are activated. Usable measuring and processing units are known per se and need not be described in greater detail at this point.

In order that also incorrectly fitted staples (e.g. tilted or displaced staples) can be detected as faulty, it is advantageous to make the measuring gap between the two conductor parts 10.1 and 10.2 as wide as possible, so that e.g. a tilted staple produces no contact between the two conductor parts and is recorded as a fault.

If the printed product to be controlled has several staples, they are checked in each case by a separate apparatus according to the invention, the apparatuses being positioned at the same point or in succession along the printed product conveying direction. It is possible to connect several circuits on the same measuring and processing unit.

There are also processing methods in which sheets in the still unfolded state are stapled and then folded. For checking the stapling after folding it is possible to use the method described in conjunction with FIGS. 1*a* and 1*b*. However, if it is wished to check the stapling prior to folding, i.e. on the flat printed products, then at least the two conductor parts 10.1 and 10.2 must be so movably arranged that in the vicinity of the stapling they can be lowered onto the product moved passed and then raised again from the printed product flow up to the next stapling to be checked. In such a case the printed products are not normally located on individual supports and are instead, for example conveyed on a conveyor belt or moved over a flat, stationary support, for example by grippers.

If the printed products are stiff enough, they can themselves serve as abutments for the scanning operation, i.e. they can e.g. be conveyed with the aid of grippers and without a support through the scanning system.

If the position of the printed products or the staples to be controlled can vary perpendicularly to the conveying direction S, it is possible to use the open circuit diagrammatically shown in FIG. 2, which has several, for example seven, conductor parts 10.3 to 10.9, distributed over the possible range of the staples 20 to 23.0 conductor parts 10.8 to 10.9 are alternately connected with the two poles of the voltage source 11. The width of the measuring gaps between the contacting ends of conductor parts must be smaller than half the width of the staples.

In the same viewing direction as in FIG. 1, FIG. 3 or shows a detail of an exemplified embodiment of the apparatus according to the invention, which is once again represented in an application for controlling a stapled connection. With respect to the conveyed flow of printed products, FIG. 3 only shows the stapling point of one printed product 1, whose staple 2 is scanned by the two conductor parts 10.1 and 10.2. The two conductor parts 10.1 and 10.2 advantageously are made from a resilient material, and are arranged so that they can easily be deflected by the staple 2 out of their inoperative position against the spring tension (perpendicular to the paper plane in FIG. 3), so that the staple 2 and conductor parts 10.1 and 10.2 are slightly pressed against one another by spring tension during scanning.

The two conductor parts 10.1 and 10.2 are assembled at their distal ends on an electrically insulating assembly block, or support member whose position parallel to the folded edges of the products to be controlled and whose angle to the conveying direction S (perpendicular to the paper plane) is adjustable by a displacement on or a rotation around a shaft 5. With such a setting, the apparatus can be adjusted for different staple positions and for different product thicknesses and contact pressures.

Figure 4:
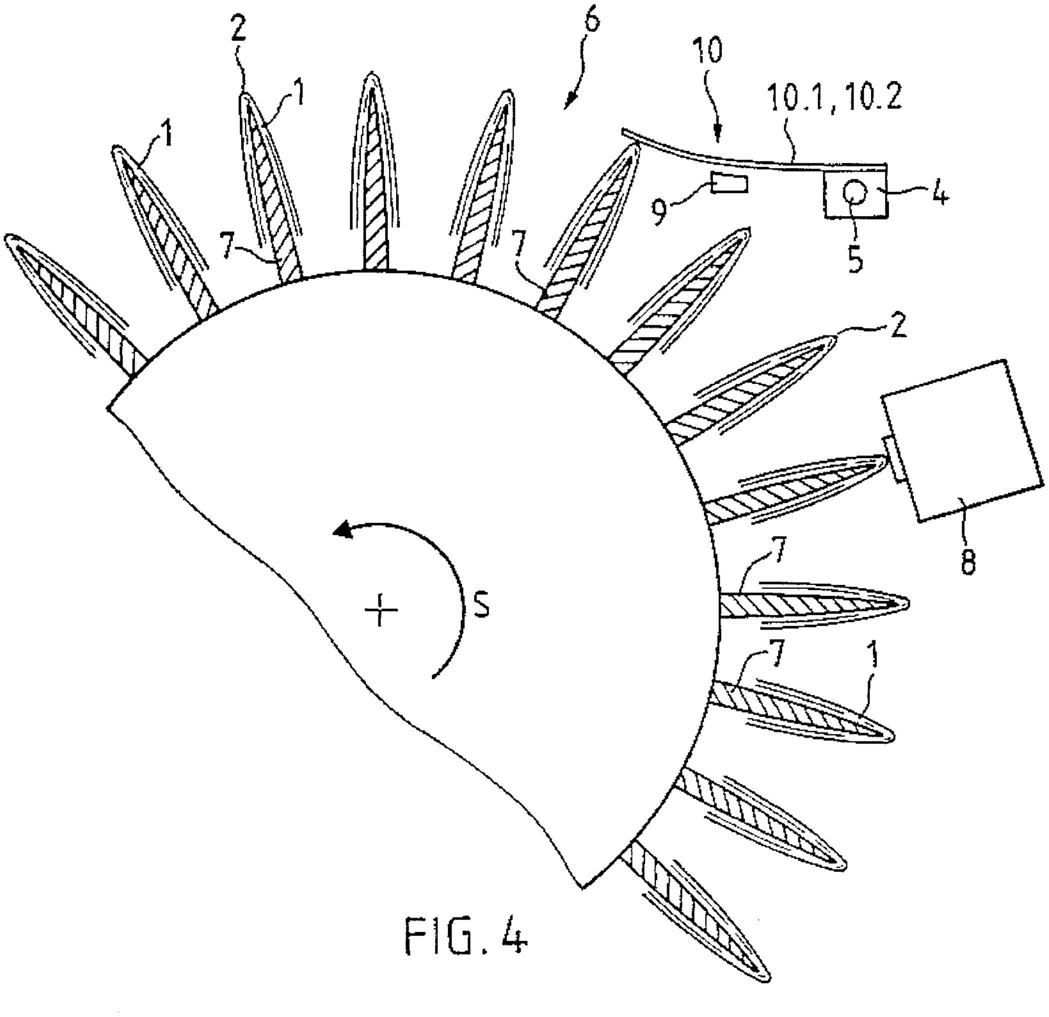
FIG. 4 shows the apparatus of FIG. 3 used in conjunction with a processing drum having a stapling device.

FIG. 4 diagrammatically shows the apparatus according to FIG. 1 used on a processing drum or radial carrier member, for example a collecting drum, as described in European Patents 546,326 (F319) and 550,828 (F321) of the same applicant. In such a processing drum the folded sheets 1 are collected on saddle-shaped supports 7 and move round the drum circumference and also simultaneously in the axial direction against the drum outlet end. At least on the underside of the drum, the printed products are secured on the supports by corresponding retaining means. During each revolution a further sheet can be supplied. A revolution following the supply revolutions, stapling takes place by a stapler 8 and the stapling is controlled by a control device 10 according to the invention. The stapled products are then usually removed by means of grippers.

FIG. 4 is a diagrammatic section through the processing drum in the vicinity of the stapling and control device. The stapler 8 and the control device 10 are arranged advantageously in directly succeeding manner on the drum circumference in the printed product conveying direction S. At the drum outlet can be provided a switch point (not shown), with the aid of which incorrectly stapled products can be discharged, or the removing grippers controlled in such a way that a gripper removing a faulty product opens over the dumping station and allows the faulty product to drop.

FIG. 4 also makes it clear that through the setting of the device 10 about the shaft 4 described in conjunction with FIG. 3 the contact pressure of the resilient conductor parts 10.1/2 can be adjusted. In order that the conductor parts do not have to be excessively deflected from their inoperative position by the printed products moving on the drum circumference, even in the case of a relatively high contact pressure, which could lead to an undesired, pronounced springiness, it is advantageous to define by means of a stop 9 a pretensioned inoperative position. With such a stop, which is advantageously adjustable, the travel of the conductor parts can be limited to a minimum.

Figure 5:
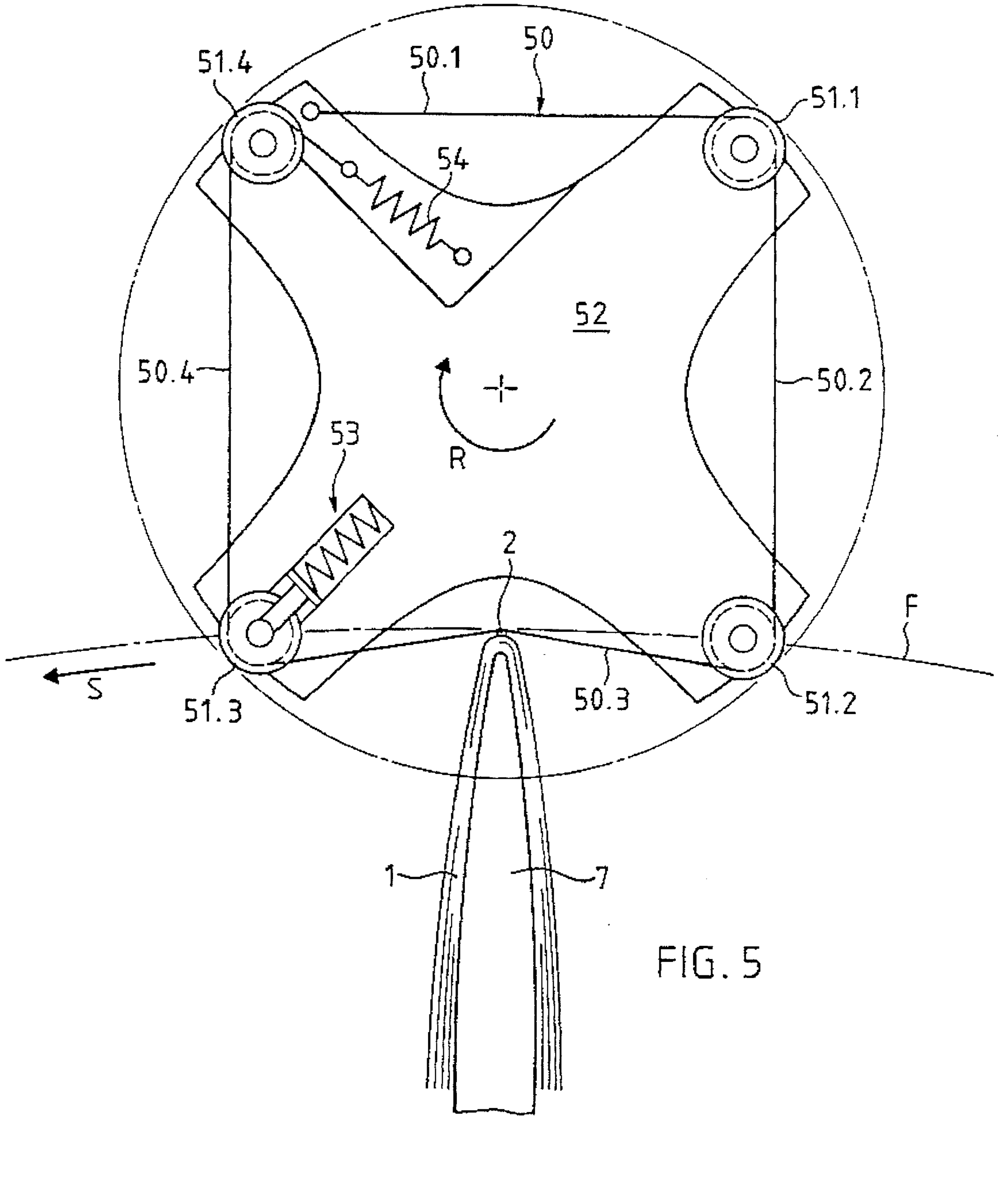
FIG. 5 shows another exemplified embodiment of the apparatus according to the invention for checking the stapling of continuously conveyed printed products.

In the embodiments of the apparatus according to the invention in FIGS. 1 to 4 the printed products move, whilst the open circuit and in particular the conductor parts are stationary. Thus, during scanning there is a frictional relative movement between the conductor parts and the contact object (e.g. a staple), which is advantageous for establishing electric contact, because as a result of such a contact disturbing oxide layers can be removed. For very rapidly moving printed products, for which this relative movement is also very fast, the relative movement can have disadvantageous effects, so that there is a desire to slow down or even prevent the frictional movement by a limited joint movement of the conductor parts. FIG. 5 shows an embodiment of the apparatus according to the invention in which the frictional movement speed is not the same as the product conveying speed.

Thus, FIG. 5 shows an exemplified embodiment of the apparatus according to the invention in which the conductor parts move. The apparatus is shown with a viewing direction perpendicular to the conveying direction S (corresponding to the circumference of a processing drum) of the printed products. FIG. 5 shows only a single printed product 1 which is just being scanned by the conductor parts. The path of printed product 1 around the processing drum is indicated as F. The two conductor parts are formed by wires, which are parallel to one another and whereof only one conductor part (50) can be seen in the drawing. The wires 50 are advantageously resiliently mounted in freely stretched lengths 50.1 to 50.4 with the aid of at least two electrically insulated double pulleys 51.1 to 51.4, which are placed on equidistant arms of a radial, rotating as indicated by (arrow R) carrier member 52. The two wires may be closed or not, as shown. The resilience of the wires is brought about by a resilient fastening 53 of at least one carrier pulley and/or by in each case one spring 54 integrated into the wire path and as a result of which the wire length is resiliently variable. It may also be the case that the elasticity of the wires is sufficient for the desired spring action, so that no additional spring means have to be provided.

The carrier member 52 is so positioned in the vicinity of the product flow (path F), that the printed products 1, or their staples 2, can be brought in each case into contact with a freely stretched length 50.3 of both wires 50, so that the wires are pressed against an elastic or a spring-exerted force against the support with the printed product. The rotation R of the carrier member 52 is adjusted in such a way that the wire length (50.3) for the scanning moves in the same direction as the printed product to be scanned and with a speed which differs by the speed of the desired frictional movement compared with the conveying speed of the printed products and that in the gaps between two printed products the following carrier pulley (51.2) is moved through the product flow, so that the next freely stretched wire length (50.2) is brought into contact with the next printed product (or its staple).

The carrier member 52 is operatively connected to a corresponding drive for its rotation R. The electrical connection between the wires rotating with the carrier member and the remaining, stationary parts of the open circuit is brought about in known manner by means of sliders or brushes, which are not shown in the drawing. It is possible to arrange the sliders or brushes in such a way that they only produce a contact between the wires 50 and the other parts of the circuit for as long as a freely stretched wire length interacts with a support and a printed product or as is necessary for an appropriate, measurement that can be evaluated.

Figure 6A:
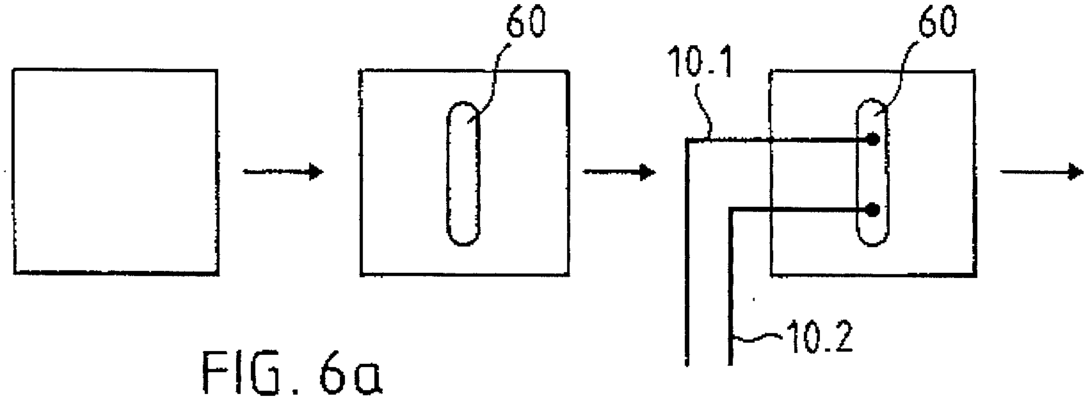
FIGS. 6*a* to 6*c* show diagrams of further applications of the method and apparatus according to the invention.
Figure 6B:
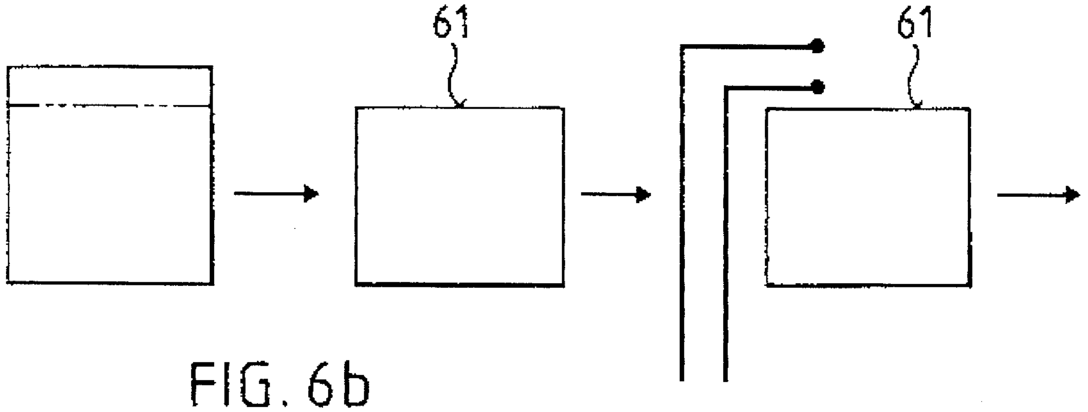
Figure 6C:
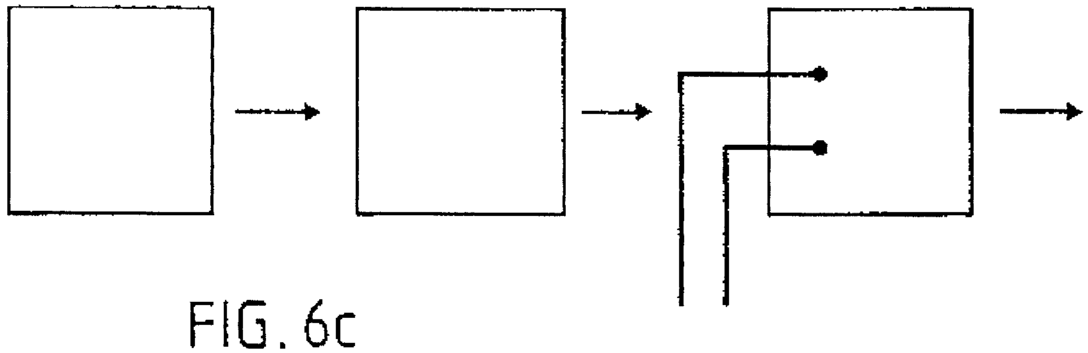

FIGS. 6*a* to 6*c* diagrammatically show further applications of the method according to the invention. From left to right a printed product before and after a processing stage to be controlled, as well as a printed product which is just interacting with the control device. For all the represented applications it is unavoidable that the printed products are conveyed on a metallic or at least partly metallic support.

FIG. 6*a* shows the control of a perforation of printed products. Diagrammatically the printed product to be controlled has a hole or a gap 60, in whose extension, transversely to the conveying direction, are positioned the two scanning conductor parts 10.1 and 10.2. If the gap is present, the two conductor parts at the location of the gap contact the metal substrate and the circuit is closed. If the gap is not present, the conductor parts contact the printed product and the circuit is not closed. If the printed product is so placed on a saddle-shaped support that the gap is positioned over the saddle line, a correct printed product is not scanned (only the support under the gap).

FIG. 6*b* shows the control of an edge cut. The two scanning conductor parts are located outside the cut edge 61 and in the case of a correctly cut printed product do not scan the product, but instead the metal support, so that the circuit is closed. In the case of a faulty product the circuit is not closed, because the actual product is scanned by at least one conductor part.

FIG. 6*c* shows the use of the method according to the invention for controlling the presence of a supplied product. If the product is present the circuit is not closed, whereas if it is not present, it is closed by the metal support. In this application each correctly present printed product is scanned, i.e. it is here a question of a control which is linked with a contact of the printed product and is not suitable for sensitive printed products.

In the same way and as shown in FIGS. 6*a* to 6*c*, further uses of the method and apparatus according to the invention are conceivable. The control can for example also relate to metal coatings, their extent or position. The arrangement of the scanning conductor parts is not necessarily such that the measuring gap to be closed by the metal contact element is substantially transversely positioned to the conveying direction. It is also possible to have scanning conductors performing a control function by a metal contact element with an extension in the conveying direction.

I claim:

1. A method for controlling a conveyance of printed products including the steps of:

- conveying the printed products continuously and in successive manner in a conveying direction into a region adjacent a circuit when the circuit is open, the circuit including at least two conductor parts and a voltage source;
- scanning the printed products by simultaneously bringing the at least two conductor parts into contact with a metallic contact portion of one of the printed products and at least one support for supporting the printed products thereby closing the circuit for allowing electric current to flow in the circuit;
- monitoring an actual time behavior of the electric current flowing in the circuit; and
- generating a control signal in response to a divergence of the actual time behavior of the electric current from a desired time behavior of the electric current.

2. The method according to claim 1, wherein the step of conveying includes the step of moving the at least one support in the conveying direction.

3. The method according to claim 1, wherein the step of conveying includes the step of conveying the printed products while the at least one support is stationary.

4. The method according to claim 1, wherein the step of conveying includes the step of conveying the printed products without using a support for the printed products.

5. The method according to claim 1, wherein the step of generating includes the step of activating an alarm.

6. The method according to claim 1, wherein the step of simultaneously bringing includes the step of pressing the at least two conductor parts against the metallic contact portion.

7. The method according to claim 1, wherein the step of simultaneously bringing includes the step of simultaneously bringing the at least two conductor parts into contact with the metallic contact portion while the at least two conductor parts are stationary.

8. The method according to claim 1, wherein the step of simultaneously bringing includes the step of moving the at least two conductor parts in the conveying direction.

9. The method according to claim 1, wherein the at least one support is saddle-shaped and has a saddle line thereon, and wherein the metallic contact portion is disposed on the saddle line of the at least one support.

10. The method according to claim 1, wherein the at least one support is flat, and wherein the step of simultaneously bringing includes the step of moving the at least two conductor parts toward the at least one support.

11. The method according to claim 1, wherein the step of simultaneously bringing includes the step of simultaneously bringing the at least two conductor parts into contact with a stapling point of the printed product to be controlled.

12. The method according to claim 1, wherein the step of simultaneously bringing includes the step of simultaneously bringing the at least two conductor parts into contact with the metallic contact portion of the at least one support when the metallic contact portion is not covered by a printed product.

13. The method according to claim 1, wherein the step of simultaneously bringing includes the step of simultaneously bringing the at least two conductor parts into contact with the metallic contact portion of the at least one support when the metallic contact portion is exposed by one of a gap, a fold, and a cut present in a fault-free printed product.

14. The method according to claim 1, wherein the step of scanning includes the step of using the at least two conductor parts to verify at least one of a positioning and a presence of the printed products on the at least one support.

15. An apparatus for controlling a conveyance of printed products comprising:

- means for conveying a plurality of printed products continuously and in successive manner in a conveying direction;
- a circuit disposed adjacent the means for conveying and including at least two conductor parts and a voltage source having a first pole and a second pole, the means for conveying being effective for conveying the printed products into a region adjacent the circuit when the circuit is open;
- means operatively connected with the circuit for scanning the printed products by simultaneously bringing the at least two conductor parts into scanning contact with a metallic contact portion of one of the printed products and at least one support for supporting the printed products thereby closing the circuit for allowing electric current to flow in the circuit; and
- a measuring and processing unit operatively connected with the circuit for measuring an electric current flow within the circuit when the circuit is closed and processing a corresponding measuring signal to generate a control signal in response to a divergence of an actual time behavior of the electric current from a desired time behavior of the electric current.

16. The apparatus according to claim 15, wherein the at least two conductor parts comprise at least four conductor parts having contacting ends disposed on a single line, the at least four conductor parts being connected alternately to the first pole and the second pole of the voltage source.

17. The apparatus according to claim 15, wherein the at least two conductor parts are made from a resilient material, each of the at least two conductor parts having a contacting end and a distal end, the apparatus further including an electrically insulating support member for supporting the at least two conductor parts, the at least two conductor parts being installed at distal ends thereof on the support member.

18. The apparatus according to claim 17, and further including a shaft fitted onto the support member such that the support member is adjustably positioned along a length of the shaft and about a longitudinal axis of the shaft.

19. The apparatus according to claim 17, and further including a stop disposed adjacent the at least two conductor parts for limiting a spring back motion of the at least two conductor parts after each time the at least two conductor parts are simultaneously brought into contact with the metallic contact portion.

20. The apparatus according to claim 15 wherein the at least two conductor parts comprise wires, the apparatus further including:

electrically insulating pulleys for tensioning the wires parallel to one another;

a radial carrier member having arms connected to the insulating pulleys; and a drive operatively connected with the radial carrier member for producing a rotation thereof.

21. The apparatus according to claim 20, and further including a resilient fastener fitted onto at least one of the pulleys for resiliently pressing the wires against the metallic contact portion.

22. The apparatus according to claim 1, wherein the resilient fastener includes resilient means integrated into each of the wires.

23. A method of using the apparatus according to claim 15 including the step of simultaneously bringing the at least two conductor parts into contact with metal staples.

24. The method according to claim 23, and further including the step of conveying the printed products by means of a processing drum equipped with a stapler.

* * * * *